United States Patent [19]

Brewer et al.

[11] Patent Number: 5,433,791
[45] Date of Patent: Jul. 18, 1995

[54] MBE APPARATUS WITH PHOTO-CRACKER CELL

[75] Inventors: Peter D. Brewer, Westlake Village; Clifford A. LeBeau, Newbury Park, both of Calif.

[73] Assignee: Hughes Aircraft Company, Los Angeles, Calif.

[21] Appl. No.: 249,423

[22] Filed: May 26, 1994

[51] Int. Cl.$^6$ ............................................. C23C 16/00
[52] U.S. Cl. .......................... 118/724; 118/723 VE; 118/725; 118/726; 219/390
[58] Field of Search ............ 118/723 R, 723 VE, 724, 118/725, 726; 219/390; 437/105

[56] References Cited

U.S. PATENT DOCUMENTS

| | | | |
|---|---|---|---|
| 5,041,719 | 8/1991 | Harris et al. | 118/725 |
| 5,156,815 | 10/1992 | Streetman et al. | 118/724 |
| 5,298,759 | 3/1994 | Brewer et al. | 250/492.1 |

Primary Examiner—R. Bruce Breneman
Assistant Examiner—Ramamohan Rao Paladugu
Attorney, Agent, or Firm—V. D. Duraiswamy; Wanda Denson-Low

[57] ABSTRACT

Ultraviolet (UV) light from a lamp or UV laser, such as a metal can short arc xenon lamp or excimer laser, respectively, is provided for cracking Group V and Group VI species comprising clusters (dimers and tetramers) or metal-organic molecules to form monomers (atoms). The UV radiation interacts with a molecular beam of Group V and Group VI species subsequent to their generation in a source cell and thermal cracking. The source cell may comprise an effusion source in molecular beam epitaxy (MBE) apparatus, a thermal cracker cell in gas-source MBE apparatus, or a gas injector cell in metal-organic MBE apparatus (MOMBE). Light from the UV lamp or laser is coupled into a vacuum chamber in which the source cell is located, at a point below the source cell and is then directed along a path parallel to the source cell by a first reflector and finally directed onto the thermally-cracked beam of molecules by a second reflector, where the UV radiation photo-cracks the molecular beam.

20 Claims, 2 Drawing Sheets

MBE APPARATUS WITH PHOTO-CRACKER CELL

ORIGIN OF INVENTION

The present invention was made with Government support under Agreement No. MDA972-93-H-0005 awarded by DARPA. The Government has certain rights in this invention.

CROSS-REFERENCE TO RELATED APPLICATION

The present application is related to application Ser. No. 08/019,965, filed Feb. 19, 1993.

BACKGROUND OF THE INVENTION

1. Field of the Invention

The present invention relates to molecular beam epitaxial formation of semiconductor layers, and, more particularly, to an apparatus for use in molecular beam epitaxial systems for converting dimers and tetramers of metals, i.e., clusters of metal atoms, to monomers.

2. Description of Related Art

Molecular beam epitaxy (MBE) is an ultrahigh vacuum technique for depositing single crystal semiconducting, insulating, and metallic materials. The advantages of MBE over other growth techniques include the ability to produce high purity materials with precise control of composition, layer thickness, and dopant (impurity) concentrations. In MBE, growth is achieved by directing "molecular" beams of the desired constituents onto a heated substrate in an ultrahigh vacuum chamber. These source beams traditionally are formed by heating a small reservoir that contains the relevant material in solid form so that sublimation or evaporation occurs. The design of the crucible that holds the source material, in conjunction with apertures external to the crucible, result in a directed beam of neutral molecules that impinge on the substrate at a rate that is controlled by the crucible temperature.

Thermal "effusion" sources of the type just described produce, in general, a mixture of both atoms and molecules that contain the atomic species of interest. Sources for elements from columns II, III, and IV of the Periodic Table tend to produce primarily atoms, whereas sources for elements from columns V and VI contain primarily tetramer (4-atom) and dimer (2-atom) clusters. Since the growth of a crystalline layer at the substrate surface ultimately requires individual atoms, dimers and tetramers must somehow be separated into atoms in order for epitaxial growth to occur.

Current practice relies on thermal energy from the substrate to "crack" the clusters on the surface and thereby separate them into individual atoms. However, this surface-cracking process is very temperature-dependent, and can be quite inefficient, requiring large excess incident fluxes of molecules to achieve the required incorporation of the species of interest. In some cases, it is not possible to find a substrate temperature at which all the necessary atomic species are efficiently produced at the surface, and thus it is essentially impossible to grow certain materials using conventional thermal effusion sources. An example of this type of limitation occurs in the growth of III-V ternary alloys containing two Group V constituents, such as $GaAs_xSb_{1-x}$, where the value of x ranges from greater than 0 to less than 1. MBE growth of these materials using conventional thermal sources for As and Sb has been largely unsuccessful due to an inability to control the relative proportions of the Group V elements in the crystal. This problem is directly linked to the molecular nature of the sources and their consequent inefficient incorporation into the growing crystal. The availability of atomic sources for As and Sb would eliminate the problem and permit the growth of high-quality crystals of such materials.

The problem of non-atomic source beams has been recognized in the past, and some improvement has been achieved by adding a high-temperature "cracking" tube at the output of a conventional thermal effusion cell in order to achieve some conversion of tetramers to dimers. This has improved the control of MBE growth of crystals containing Group V species, but does not approach the level that could be achieved using pure monomeric (atomic) beams. In principle, if the cracking tube could be operated at a sufficiently high temperature, then the complete reduction of clusters to atoms would occur. However, in practice, the high temperatures required to produce a substantial atomic fraction from such a source are incompatible with the ultrahigh vacuum growth environment required to produce high purity crystals. For this reason, thermal cracker cells are usually employed only to reduce tetramers to dimers, and are not effective for producing beams that are substantially monomeric.

MBE is also practiced in another form in which gaseous sources are used instead of or in addition to effusion cells to form the source beams. Sources for gas-phase MBE, including metal-organic MBE (MOMBE), are typically metal organic or metal hydride molecules. Thermal dissociation of the molecules on the growth surface is usually relied upon to liberate the metal atoms. However, the thermal dissociation reaction is often very inefficient at the desired substrate (growth) temperature. Moreover, carbon-containing organic fragments produced by the dissociation can result in carbon contamination of the growing crystal. In an effort to circumvent these limitations, a thermal cracker tube can be used with a gas source to crack the source molecules before they reach the substrate. However, in the case of Group V and VI metal-organics, it has been found that the metal atoms recombine within the cracker tube to form dimers and tetramers. Thus, this type of source suffers from the same problem as the thermal effusion cells used in conventional MBE, namely, that it does not produce an atomic beam.

The related application to the present application, Ser. No. 08/019,965, discloses and claims apparatus and process for converting dimers and tetramers to monomers. This is achieved by utilizing UV light from one or more linear flashlamps to photodissociate molecular beams of Group V and VI clusters. The device is positioned in the output stream of the MBE or MOMBE source. The flashlamp is placed along one focus of an elliptically-shaped, reflective cavity, with the molecular beam path lying along the other focus. This design requires that the original source position be retracted (~25 cm) to allow the photo-cracker cell to be interposed between it and the system. This increase in the source to sample distance, however, greatly reduces the flux of the cell at the sample position. The transverse optical configuration also requires increasing the tubulation size of the source nipple to facilitate the removal of the flashlamps or in a different approach to dramatically lengthening the source-to-sample distance >50 cm. In either case, the original photo-cracker cell design would unfortunately require substantial modifications to the MBE or MOMBE system.

Further, while the photo-cracker cell of the parent application is useful in new MBE or MOMBE systems, it is not easily used as a retrofit for existing systems.

Accordingly, there remains a need for providing a photo-cracker cell that can be retrofit on existing MBE and MOMBE systems, essentially as a bolt-on unit.

SUMMARY OF THE INVENTION

In accordance with the invention, an improved photo-cracker cell, capable of retrofit onto existing MBE and MOMBE systems, is provided. Such systems include a source cell comprising (i) means for generating a molecular beam of Group II, III, IV, V, or VI clusters, (ii) means for thermally cracking the molecular beam to provide dimers and/or tetramers of the clusters, (iii) a heat shield surrounding the source cell, and (iv) a vacuum chamber containing the source cell. The improved photo-cracker cell of the present invention comprises:

(a) at least one source of UV radiation;
(b) means for introducing the UV radiation into the vacuum chamber at a location below the thermal cracking means and normal to the path of the molecular beam;
(c) first means for directing the UV radiation introduced into the vacuum chamber between the heat shield and the vacuum chamber, parallel to the path of the molecular beam; and
(d) second means for directing the UV radiation from the first means onto the molecular beam beyond the thermal cracking means.

The purpose of the present invention is to improve the design of the photo-cracker cell disclosed and claimed in application Ser. No. 08/019,965 to allow it to be retrofitted onto existing MBE or MOMBE machines without substantial reworking of the system. The improvements are largely the result of a new optical delivery system which is used to introduce the UV light into the cell and direct it onto the molecular beam. The improved photo-cracker cell becomes a bolt-on addition to existing conventional thermal effusion cells or metal organic gas phase sources which converts them into compact, efficient Group V or VI atomic sources. The new design does not change the source to sample distance, so the original angular flux distribution and gas densities are maintained. The new design also reduces the cost of fabricating and operating the photo-cracker cell. The reduced operating cost result from the use of metal can short xenon arc lamps which are less expensive and have longer operating lifetimes ($>10^9$ shots) than linear xenon flashlamps ($>10^6$).

DESCRIPTION OF THE PREFERRED EMBODIMENTS

Figure 1:
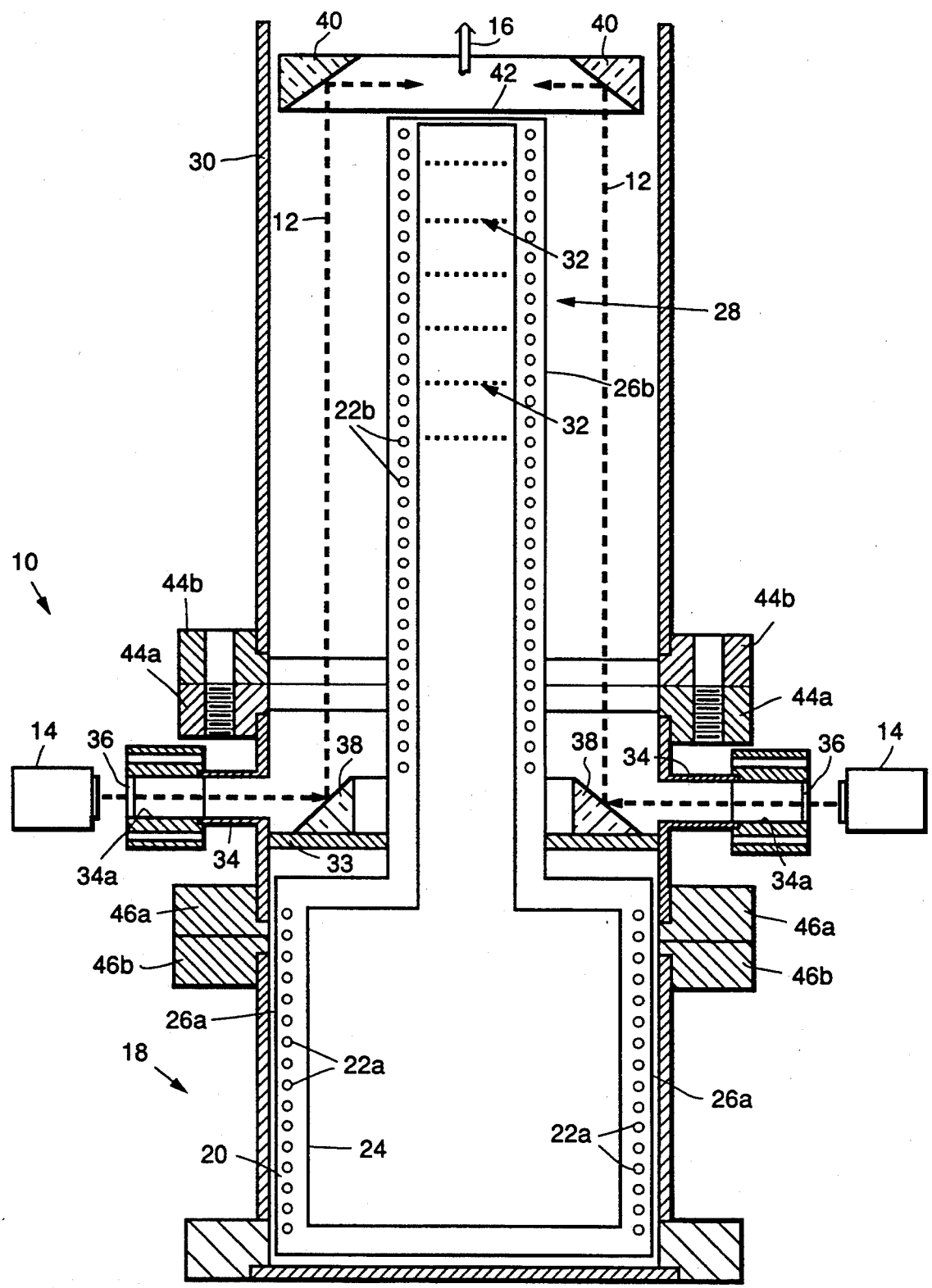
FIG. 1 is a cross-sectional view of the photo-cracker cell of the invention, depicting its basic embodiment.

The photo-cracker cell of the present invention is a device for producing a monomeric (atomic) beam of Group V or Group VI atoms by photodissociation of the effluent from a conventional thermal effusion cell in MBE, a thermal cracker in gas-source MBE, or parent gas molecules from an injector in MOMBE. The atomic beam thus produced can be used for the growth or doping of semiconductor thin films. The availability of an atomic beam offers distinct advantages over conventional sources in terms of control of the composition and doping of layers grown by MBE, gas-source MBE, and MOMBE.

Currently, MBE gas and solid sources utilize thermal "cracking" in an attempt to dissociate the tetramer and dimer components that are produced by simple molecular effusion sources. However, the generation of monomeric beams of Group V and VI elements by thermal dissociation is very inefficient, and the monomer fraction from such sources is extremely low. In the present invention, UV light is used to photodissociate the output beam from a thermal cell, thereby achieving a very high fractional content of monomeric species in the beam.

As contemplated herein, the Group V species typically comprises arsenic (As) and antimony (Sb), while the Group VI species comprises tellurium (Te) and selenium (Se). However, it will be readily appreciated that the teachings of the present invention are not to be construed as limited to these particular species.

The purpose of the photo-cracker cell of the invention is to generate pure atomic beams, that is, beams of monomeric species, of Group V and VI elements in order to improve the control of composition and doping of semiconductor layers by MBE, gas-source MBE, and MOMBE. This improvement results from the increased sticking coefficient of monomeric species on a semiconductor surface compared to that of dimer or tetramer clusters, and the ability to monitor and control the flux of an atomic beam. The low efficiency of presently-employed thermal cracking of Group V and VI clusters in MBE, gas-source MBE, and MOMBE leads to a large fraction of dimers and tetramers in the beam. This limits the precision of composition and doping control because of the low-sticking coefficients of the molecular species and the effects of co-adsorption on the incorporation rate of atoms into the growing layer.

An example is described for the growth of GaAs$_x$Sb$_{1-x}$ using a monomer source for the antimony flux (which has near-unity sticking coefficient). In this application, an antimony flux is established which produces the desired 1-x value with respect to the Ga flux. The As flux is then allowed to flood the surface in excess to provide sufficient Group V species to react and combine with the remaining gallium, thus producing the desired alloy. Since the sticking coefficient of atomic Sb is high, virtually all of the Sb flux contributes to layer growth. The As over-pressure provides the remaining Group V species for utilization of the Ga flux, and the excess is re-evaporated (as occurs in conventional GaAs growth, in which an excess As flux is also employed).

The applications for an atomic cracker cell extend from (a) III-V material growth, where the Group V source has a direct influence on growth rate and alloy composition, to (b) Group IV material growth, where Group V elements are used as n-type dopants, and to (c) II-VI growth, where Group VI elements control the composition and Group V elements are dopants. Examples of Group V clusters that may be treated in accordance with the teachings of the present invention to form monomers include $As_2$, $As_4$, $Sb_2$, and $Sb_4$. Examples of Group VI clusters include $S_2$–$S_8$, $Se_2$–$Se_8$, and $Te_2$. Finally, $I_2$, a Group VII element used in doping II-VI semiconductors, may also be cracked in accordance with the teachings of the present invention. Thus, the potential applications of a monomer source are very diverse.

Many MBE systems still use simple thermal effusion cells as sources for Group V and VI species. Some improvement on the simple, single-stage cell is achieved by the so-called cracker cell, which employs two stages of heating: The first generates a stable effusive flux and the second stage is operated at a higher temperature to crack the metal molecules that are produced in the first stage. The output of thermal cracker cells, however, is still largely composed of dimers and tetramers because the operating temperature of the cracking region (e.g., $\leq 1200°$ C.) is typically too low to efficiently break the $\approx 3.5$ eV bonds of metal clusters. Although specially-designed thermal cracker cells can be operated at higher temperatures in order to achieve greater cracking efficiency, this is undesirable because it increases contamination due to outgassing and desorption from the nearby vacuum system components, and the purity of the growing film can be compromised as a result. The higher temperatures of the thermal cracker can also adversely affect the substrate temperature through radiative heating.

Sources of gas-phase MBE, including MOMBE, are typically metal organic or metal hydride molecules. Thermal dissociation of the molecule on the growth surface is usually relied upon to liberate the metal atom. However, in some cases, carbon-containing organic fragments produced by the dissociation act as a source of carbon contamination of the growing crystal. Moreover, the thermal dissociation reaction is not always efficient at the desired substrate (growth) temperature. In an effort to circumvent these limitations, thermal cracker tubes have also been tried in MOMBE gas sources, but the experience to date indicates that Group V and VI metal atoms recombine within the cracker tube to form dimers and tetrameres, so this type of source suffers from some of the same problems as the thermal cracker cell used in MBE. The photo-cracker cell of the present invention may be used effectively in this application as well as in straight-forward MBE, with equivalent benefits, and without sacrificing the virtues of the gas-source method.

The improved photo-cracker cell 10 of the present invention is depicted in FIG. 1 and utilizes ultraviolet (UV) light 12 from a convenient UV source 14, such as a UV lamp or UV laser, to photodissociate molecular beams 16 of metal clusters, metal-organics, or metal hydrides. A new optical delivery system, described below, allows the UV light 12 to intersect the molecular beam 16 from a conventional MBE effusion cell 18 or MOMBE gas-phase source (not shown) without substantial changes to the original system.

The MBE effusion cell 18 or MOMBE gas-phase source (not shown) comprises a tube 20 comprising quartz, graphite, tantalum, or other refractory metal with a coil 22 of tantalum wire shielded with pyrolytic boron nitride (p-BN) to heat the source (not shown) in the crucible 24. A heat shield 26a surrounds the MBE effusion cell be or MOMBE gas-phase source (not shown) as is well-known. The heat shield 26a comprises a thin tantalum metal foil film, as is well-known, and completely surrounds the cell or source 18.

A high temperature zone ("thermal cracker") 28 is positioned to heat the beam 16 as it emerges from the bulk evaporator/sublimator 24 to crack the molecules to dimers. A heat shield 26b surrounds the thermal cracker 28 and comprises the same material as heat shield 26a.

The MBE effusion cell 18 or MOMBE gas-phase source (not shown), thermal cracker 28, and heat shield 26a, 26b are contained in a vacuum chamber 30. Baffles 32 in the thermal cracker 28 serve to increase the time the molecules spend in the high temperature zone to thereby maximize the thermal cracking process.

In the embodiment shown in FIG. 1, the UV light 12 is coupled into the vacuum chamber 30 through the base 33 of the thermal cracker and is directed along the side of heat shield 26b before being reflected into the path of the molecular beam 16. In this configuration, most of the light emanating from the lamp 14 is collected and focused onto the molecular beam 16, and thus, the highest photodissociation efficiency can be achieved.

The coupling of the UV light 12 into the vacuum chamber 30 is done by means of a vacuum-tight nipple 34 having a cylindrical passageway 34a therethrough and terminating in a sapphire entrance window 36, which is transparent to UV radiation down to 150 nm. The benefits of employing UV radiation down to 150 nm are discussed below.

The UV light 12 is introduced into the vacuum chamber 30 normal to the path of the molecular beam 16. A first UV mirror 38 directs the UV light 12 along the outside of the heat shield on a path parallel to the molecular beam 16. A second UV mirror 40 directs the UV light 12 onto the molecular beam 16.

The number of UV sources 14 can range from one to eight, with eight being the maximum nipples 34 that can be usually placed around the perimeter of the vacuum chamber 30. The use of one source 14 would likely require a rotating mirror or other means to spread the UV light 12 symmetrically about the molecular beam 16, and thus this embodiment is not as preferred as is use of a higher number of UV sources.

The UV source 14 is preferably a metal can short arc xenon lamp, which is easier to use than other UV sources and which uses a sapphire window. The metal can short arc xenon lamps thus provide an extended wavelength region over linear flashlamps, which use quartz windows and cut out at 180 nm. Advantageously, the metal can short arc xenon lamps emit UV radiation as low as 150 nm. This range can be extended advantageously to short wavelengths with other window materials such as magnesium fluoride, $MgF_2$. Alternatively, a UV laser, such as an excimer laser operating at 193 nm, may be employed in the practice of the invention.

Only UV light 12 having a wavelength of less than 250 nm has sufficient energy to dissociate Group IV and VI molecules. The ability to go down to 150 nm, and below, allows irradiating more bands in the molecules and thus provides more energy for the dissociation. In this connection, sapphire is preferred for the entrance windows 36, since other UV-transparent materials have a wavelength cutoff above 150 nm. In contrast, the linear UV flashlamps discussed above, which cut out at 180 nm, are not as efficient in photo-cracking the clusters in the molecular beam 16.

The first UV mirror 38 is a flat mirror and preferably comprises $MgF_2$-coated aluminum, which provides a reflectivity of more than 95%. One UV mirror 38 is associated with one metal can short arc xenon lamp or UV lasers 14. Thus, if eight metal can short arc xenon lamps or UV lasers 14 are employed, there are eight corresponding UV mirrors 38.

The UV light 12 from each UV source 14 is preferably collimated by a focussing lens (not shown) and is coupled to each first UV mirror 38 by conventional optics (not shown). The focussing lens and conventional optics are not shown in order to prevent cluttering of the drawing and because such optical elements are well-known and do not form a part of the present invention.

The entrance windows 36 and high reflectivity, broad-band UV mirror(s) 38 are housed remotely, away from the mouth 42 of the source, to prevent coating of the optical elements by the growth material. For some commercially available thermal cracker cells, the body of the bulk evaporator may have to be modified to provide an adequate optical path to the top of the cell.

The second UV mirror 40 comprises either a conical mirror or one or more flat metal mirrors. In this latter case, the number of second mirrors 40 is the same as the number of first UV mirrors 38 and the first and second UV mirrors are appropriately optically aligned. On the other hand, the use of a conical UV mirror eliminates the need for any extra optical alignment required using pairs of mirrors. Further, a conical UV mirror focusses the UV light 12 onto the molecular beam 16 for higher photo-cracking efficiency.

The second UV mirror 40 comprises a high reflectivity metal, such as molybdenum, tungsten, or tantalum, which reflects at least 60% of the incident UV light 12. It is desired to couple as much of the UV light 12 from the UV source 14 as possible into the molecular beam 16.

The reason that these metals are used is because the mirror is heated (by means not shown) to desorb any species from the molecular beam be. Further, Mo, W, and Ta are currently used in MBE systems, they have known properties, they do not out-gas, and they do not have many impurities. The heating requirement precludes the use of $MgF_2$-coated aluminum, which is used in the first UV mirror 38. Although aluminum has excellent reflectivity, it must be coated with the $MgF_2$ coating to prevent oxidation, and this coating is not stable at the heating temperature required to heat the second UV mirror 40, which is the temperature of the sublimator, about 300° to 600° C.

As shown in FIG. 1, the improved photo-cracker cell 10 can be built with standard vacuum flanges 44a, 46a on each end so that it can be conveniently added onto any existing MBE or MOMBE growth system by simply interposing it between the existing flanges 44b, 46b. Extension of the electrical and mechanical supports at the base of the conventional thermal effusion cell or a metal organic gas phase source can easily be accommodated to keep the original position of the cell intact.

The photo-cracking is performed on the output stream of the source cell, indicated at 16. By "source cell" is meant a thermal effusion cell in MBE, a thermal cracker cell in MBE or gas-source MBE, or a gas injector in MOMBE, as described above.

The beam of Group V or Group VI species that is produced in accordance with the invention is substantially monomeric. By this is meant that whereas thermal cracking produces a beam that, at best, contains about a small fraction of monomeric species, the present invention, employing photo-cracking (UV light), is expected to produce a beam that contains at least about a ten-fold increase in monomeric species.

EXAMPLES

Example 1

A. Tellurium Beam, without Photocracker Cell

Initial testing of the efficiency of the photocracker cell to produce a monomeric beam was performed with a commercial tellurium effusion source. The effluent of the tellurium source without the photocracker cell of the present invention was found to be comprised of only tellurium dimers ($Te_2$) and no tellurium atoms (Te). This was determined using a time-of-flight spectrometer with selective laser ionization for each of the effluent species. The beam pressure of the tellurium source used in the testing was measured to be about $10^{-6}$ Torr, which is similar to that used in MBE growth of II-VI semiconductor thin films.

B. Tellurium Beam, with Photocracker Cell

The efficiency of cracking the tellurium dimers into a monomer beam was found to be 41% under unoptimized conditions using the photocracker cell of the present invention and the dimer beam from the commercial effusion cell. These results were measured using a UV flashlamp having a power of 60 Watts and a spectral range of the output light from 150 to 300 nm. The most effective spectral range of the lamps for producing the monomer beam was below 250 nm. It is expected that the efficiency of monomer production can be increased by improving the lamp output power and extending the spectral output of the lamp to shorter wavelengths.

Example 2

A. Arsenic Beam, without Photocracker Cell

Testing of the efficiency of the photocracker cell with a UV laser light source to produce a monomeric Group V beam was also performed. In these tests, a commercial arsenic effusion source was employed whose effluent without the photocracker cell of the present invention was found to be comprised of only arsenic tetramers ($As_4$), with no arsenic dimers ($As_2$) or atoms (As). This was determined using a time-of-flight spectrometer with selective laser ionization for each of the effluent species. The beam pressure of the arsenic source used in the testing was measured to be about $10^{-6}$ Torr, which is similar to that used in MBE growth of III-V semiconductor thin films.

B. Arsenic Beam, with Photocracker Cell

The efficiency of cracking the arsenic tetramers into a monomer beam was found to be 59% under unoptimized conditions using the photocracker cell of the present invention and the tetramer beam from the commercial effusion cell. These results were measured using a UV excimer laser source having a laser fluence of 100 $mJ/cm^2$ per pulse and a photon wavelength of 193 nm (6.8 eV). It is expected that the efficiency of monomer production can be increased by improving the lamp output power and extending the spectral output of the lamp to shorter wavelengths.

Figure 2:
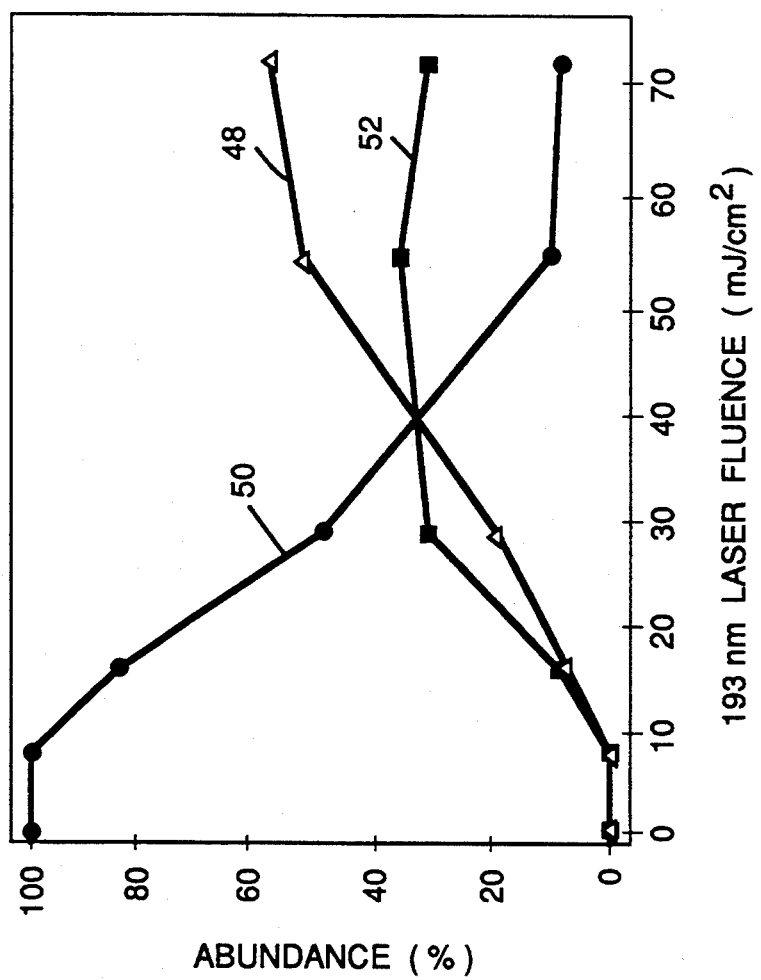
FIG. 2, on coordinates of abundance (in percent) and laser fluence at 193 nm (in Mj/cm$^2$), is a plot depicting the effect of laser fluence on the relative abundance of various arsenic species (tetramer, dimer, and monomer).

FIG. 2 shows the results of the initial testing of the photocracker cell with the UV laser light source. The Figure plots the percent abundance of all of the observed arsenic species ($As_4$, $As_2$, and As) in the effluent of the photocracked beam as a function of irradiating laser fluence. The percent abundance was measured using the time-of-flight spectrometer described above, and is provided in terms of equivalent units of $As_4$.

It is clear from FIG. 2 that by increasing the laser fluence, the percent abundance of arsenic atoms (Curve 48) increases and of arsenic tetramers (Curve 50) decreases. The dimer arsenic molecules are an intermediate species in the dissociation of the $As_4$ parent to atoms. This results in the abundance of dimers initially increasing with fluence due to the dissociation of the $As_4$ species ($As_4 \rightarrow As_2$) and then decreasing with increasing fluence as the dimers are cracked into atoms ($As_2 \rightarrow As$) (Curve 52).

Thus, there has been disclosed a method and apparatus for the production of substantially monomeric Group V or Group VI metal species. It will be readily apparent to those skilled in this art that various changes and modifications of an obvious nature may be made, and all such changes and modifications are considered to fall within the scope of the invention as defined by the appended claims.

What is claimed is:

1. A photo-cracker cell for retrofit to an existing source cell of apparatus for growth of III-V, IV, and II-VI semiconductor layers, said source cell comprising (i) means for generating a molecular beam of Group III, IV, V, VI, or VII clusters, (ii) means for thermally cracking said molecular beam, (iii) a heat shield surrounding said source cell, and (iv) a vacuum chamber containing said source cell, said photo-cracker cell comprising:
   (a) at least one source of UV radiation;
   (b) means for introducing said UV radiation into said vacuum chamber at a location below said thermal cracking means and normal to the path of said molecular beam;
   (c) first means for directing said UV radiation introduced into said vacuum chamber between said heat shield and said vacuum chamber, parallel to the path of said molecular beam; and
   (d) second means for directing said UV radiation from said first means onto said molecular beam beyond said thermal cracking means.

2. The photo-cracker cell of claim 1 wherein said at least one source of UV radiation comprises either at least one metal can short arc xenon lamp, or at least one UV excimer laser.

3. The photo-cracker cell of claim 2 wherein said at least one source of UV radiation comprises either from one to eight metal can short arc xenon lamps, or from one to eight UV excimer lasers.

4. The photo-cracker cell of claim 1 wherein said means for introducing said UV radiation into said vacuum chamber comprises at least one vacuum-tight nipple having a cylindrical passageway therethrough, with one end secured to said vacuum chamber and the opposite end provided with a UV-transparent window.

5. The photo-cracker cell of claim 4 wherein said UV-transparent window consists essentially of sapphire.

6. The photo-cracker cell of claim 1 wherein said first means for directing said UV radiation comprises at least one flat mirror at 45° to said UV radiation.

7. The photo-cracker cell of claim 6 wherein said flat mirror comprises $MgF_2$-coated aluminum.

8. The photo-cracker cell of claim 1 wherein said second means for directing said UV radiation onto said molecular beam comprises at least one mirror at 45° to said UV radiation.

9. The photo-cracker cell of claim 8 wherein said second means comprises a conical mirror.

10. The photo-cracker cell of claim 8 wherein said second means comprises at least one flat mirror.

11. The photo-cracker cell of claim 8 wherein said mirror comprises a high reflectivity metal which reflects at least 60% of incident UV radiation.

12. The photo-cracker cell of claim 11 wherein said high reflectivity metal is selected from the group consisting of molybdenum, tungsten, and tantalum.

13. Apparatus for growth of III-V, IV, and II-VI semiconductor layers, said apparatus comprising:
   (a) at least one source cell for the generation of a beam of species comprising clusters of atoms employed in said growth of said layers;
   (b) means for thermally cracking said clusters;
   (c) a growth chamber wherein said growth of said layers occurs; and
   (d) a photo-cracker cell interposed between said at least one source cell and said growth chamber, said photo-cracker cell comprising:
      (1) at least one source of UV radiation,
      (2) means for introducing said UV radiation into said vacuum chamber at a location below said thermal cracking means and normal to the path of said molecular beam,
      (3) first means for directing said UV radiation between said heat shield and said vacuum chamber, parallel to the path of said molecular beam, and
      (4) second means for directing said UV radiation onto said molecular beam beyond said thermal cracking means.

14. The apparatus of claim 13 wherein said apparatus comprises molecular beam epitaxy apparatus and said source cell comprises an effusion source.

15. The apparatus of claim 13 wherein said apparatus comprises gas-source molecular beam epitaxy apparatus and said source cell comprises a thermal cracker cell.

16. The apparatus of claim 13 wherein said apparatus comprises metal-organic molecular beam epitaxy apparatus and said source cell comprises a gas injector cell.

17. The apparatus of claim 13 wherein:
   (a) said source of UV radiation comprises either from one to eight metal can short arc xenon lamps, or from one to eight UV excimer lasers;
   (b) said means for introducing said UV radiation into said vacuum chamber comprises at least one vacuum-tight nipple having a cylindrical passageway therethrough, with one end secured to said vacuum chamber and the opposite end provided with a UV-transparent window;
   (c) said first means for directing said UV radiation comprises at least one flat mirror at 45° to said UV radiation; and
   (d) said second means for directing said UV radiation onto said molecular beam comprises at least one mirror at 45° to said UV radiation.

18. The apparatus of claim 17 wherein said UV-transparent window consists essentially of sapphire.

19. The apparatus of claim 17 wherein said flat mirror comprises $MgF_2$-coated aluminum.

20. The apparatus of claim 17 wherein said second means comprises either a conical mirror or at least one flat mirror, said mirror comprising a high reflectivity metal selected from the group consisting of molybdenum, tungsten, and tantalum.

* * * * *